United States Patent
Lavoie et al.

(10) Patent No.: US 7,365,011 B2
(45) Date of Patent: Apr. 29, 2008

(54) CATALYTIC NUCLEATION MONOLAYER FOR METAL SEED LAYERS

(75) Inventors: Adrien R. Lavoie, Beaverton, OR (US); Arnel Fajardo, Beaverton, OR (US); Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 11/269,402

(22) Filed: Nov. 7, 2005

(65) Prior Publication Data
US 2007/0105375 A1    May 10, 2007

(51) Int. Cl.
*H01L 21/44* (2006.01)
(52) U.S. Cl. ........... 438/687; 438/221; 438/240; 438/597; 257/304; 257/310; 257/374
(58) Field of Classification Search .......... 438/687, 438/479
See application file for complete search history.

(56) References Cited
U.S. PATENT DOCUMENTS 7,045,461 B2 *  5/2006  Imori et al. ............. 438/678

2001/0019891 A1 *  9/2001  Koh et al. ............... 438/687
2002/0009884 A1 *  1/2002  Pyo ......................... 438/687
2003/0082296 A1 *  5/2003  Elers et al. .................. 427/96
2004/0248403 A1     12/2004  Moon et al.
2005/0124154 A1 *  6/2005  Park et al. ................ 438/643

OTHER PUBLICATIONS

Pending U.S. Appl. No. 11/233,297, filed Sep. 21, 2005; Inventor: Arnel Fajardo et al.

* cited by examiner

*Primary Examiner*—Walter Lindsay, Jr.
*Assistant Examiner*—Abdulfattah Mustapha
(74) *Attorney, Agent, or Firm*—Rahul D. Engineer (57) ABSTRACT

A method of forming a copper interconnect on a substrate comprises providing a substrate that includes a dielectric layer and a trench etched into the dielectric layer, depositing a barrier layer within the trench, using a palladium immobilization process to form a metal catalyst layer on the barrier layer, activating the metal catalyst layer, and using a vapor deposition process to deposit a copper seed layer onto the metal catalyst layer. The vapor deposition process may include PVD, CVD, or ALD. An electroplating process or an electroless plating process may then be used to deposit a bulk copper layer onto the copper seed layer to fill the trench. A planarization process may follow to form the final interconnect structure.

25 Claims, 9 Drawing Sheets

CATALYTIC NUCLEATION MONOLAYER FOR METAL SEED LAYERS

BACKGROUND

In the manufacture of integrated circuits, copper interconnects are generally formed on a semiconductor substrate using a copper damascene process (e.g., a dual damascene process which is well known in the art). In this process, a trench is etched into a dielectric layer and the trench is filled with a barrier layer, an adhesion layer, and a seed layer. For instance, a physical vapor deposition (PVD) process, such as a sputter process, may be used to deposit a tantalum nitride barrier layer and a tantalum adhesion layer (i.e., a TaN/Ta stack) into the trench. This may be followed by a PVD sputter process to deposit a copper seed layer into the trench. An electroplating process is then used to fill the trench with copper metal to form the interconnect.

As device dimensions scale down, the aspect ratio of the trench becomes more aggressive as the trench becomes more narrow. This gives rise to issues in the copper seed deposition and plating processes such as trench overhang, thereby resulting in pinched-off trench openings and inadequate gapfill. One approach to addressing these issues utilizes electroless deposition processes to deposit copper into the narrow trenches. Electroless deposition processes permit copper seed or copper gapfill deposition directly on the TaN/Ta stack. Eliminating the metal seed layer widens the available gap for subsequent metallization.

Reducing the thickness of the TaN/Ta stack is another approach to widening the available gap for metallization. In known processes, the Ta adhesion layer is required because metals deposited using conventional vapor deposition processes do not readily nucleate on the TaN barrier layer, leading to problems such as film delamination or agglomeration. Unfortunately, thinner films of TaN/Ta that have been evaluated are limited by the non-conformal characteristic of PVD deposition techniques. Accordingly, alternative techniques for reducing the thickness of the TaN/Ta stack are needed.

DETAILED DESCRIPTION

Described herein are systems and methods of promoting the deposition of metals directly onto barrier layers without the need for an adhesion layer. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention enable the formation of copper interconnects with a lower likelihood of defect or void formation relative to conventional copper interconnects. The copper interconnects of the invention are formed without the use of an adhesion layer between the barrier layer and the metal layer. Eliminating the adhesion layer widens the available gap for metallization, thereby reducing the likelihood of trench overhang that can lead to void formation. In lieu of the adhesion layer, a monolayer of a metal catalyst/coupling agent combination is formed on the barrier layer that facilitates metal deposition directly onto the barrier layer using conventional vapor deposition techniques, such as atomic layer deposition (ALD) or chemical vapor deposition (CVD). The monolayer may be formed using a wet chemical metal-immobilization-process (MIP) surface treatment. Metal centers that may be used in the MIP surface treatment include, but are not limited to, palladium, platinum, ruthenium, iridium, rhenium, rhodium, and osmium. The methods described herein therefore provide a catalytic monolayer onto which metals can nucleate during ALD or CVD processes.

Figure 1A:
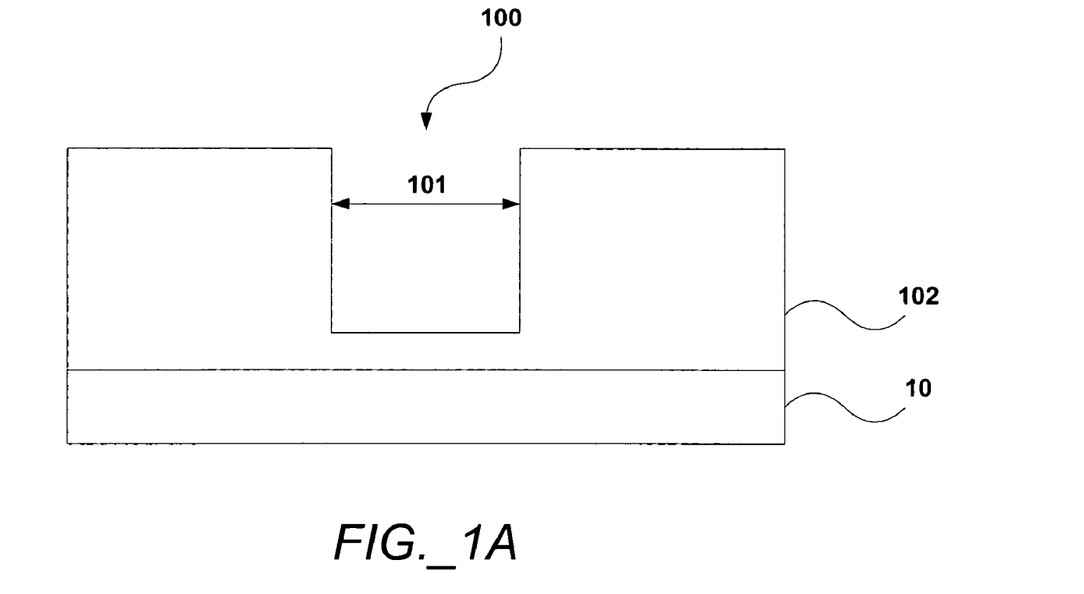
FIGS. 1A to 1E illustrate a conventional method for forming an interconnect.

FIGS. 1A to 1E illustrate a well known damascene process for forming copper interconnects on a semiconductor wafer 10. FIG. 1A illustrates at least one trench 100 that has been etched into a dielectric layer 102. The trench 100 has a gap 101 through which metal may enter the trench 100 during metallization processes. The dielectric layer 102 is formed in the semiconductor wafer 10 and provides insulation between electrical components. As semiconductor device dimensions decrease, electrical components such as interconnects must be formed closer together. This increases the capacitance between components with the resulting interference and crosstalk degrading device performance. To reduce the interference and crosstalk, dielectric materials with lower dielectric constants (i.e., low-k dielectric materials) are used to provide insulation between electrical components. Common dielectric materials that may be used in the dielectric layer 102 include, but are not limited to, oxides such as silicon dioxide ($SiO_2$) and carbon doped oxide (CDO), organic polymers such as perfluorocyclobutane (PFCB), or fluorosilicate glass (FSG).

Conventional photolithography techniques may be used to etch the trench 100 into the dielectric layer 102. As is well known in the art, one photolithography technique includes depositing a photoresist material onto the dielectric layer 102, exposing the photoresist material to ultraviolet radiation using a patterned mask, developing the photoresist material, etching the dielectric layer 102, and then removing the photoresist material. The photoresist material that remains after development functions as a mask to allow only selected portions of the dielectric layer 102 to be etched, thereby forming structures such as the trench 100.

Figure 1B:
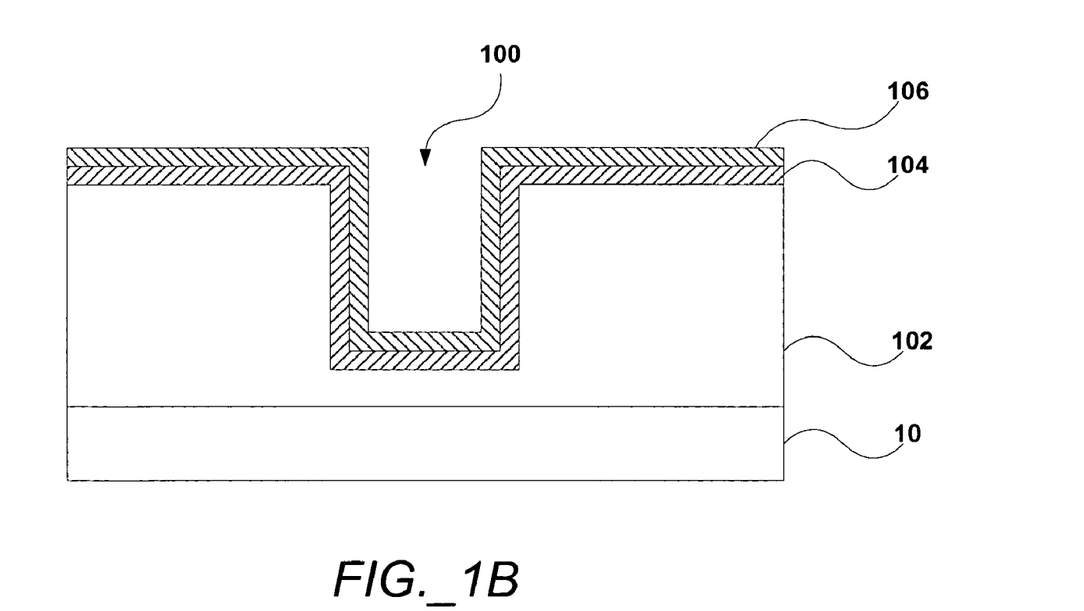

FIG. 1B illustrates the trench 100 after a barrier layer 104 and an adhesion layer 106 have been deposited. The barrier layer 104 is generally formed using a material such as tantalum nitride (TaN) and prevents copper metal from diffusing into the dielectric layer 102, which would likely reduce performance of the interconnect and may lead to electrical shorts. The adhesion layer 106 is generally formed using a metal such as tantalum (Ta) or ruthenium (Ru) and enables copper metal to become deposited onto the barrier layer 104. Copper metal generally cannot deposit directly onto TaN, therefore the adhesion layer 106 acts as an intermediary to bind the copper metal to the barrier layer 104. As shown in FIG. 1B, the deposition of the TaN barrier layer 104 and the adhesion layer 106, a combination that is often referred to as a TaN/Ta stack or a TaN/Ru stack, narrows the available gap 101 for subsequent metallization.

Figure 1C:
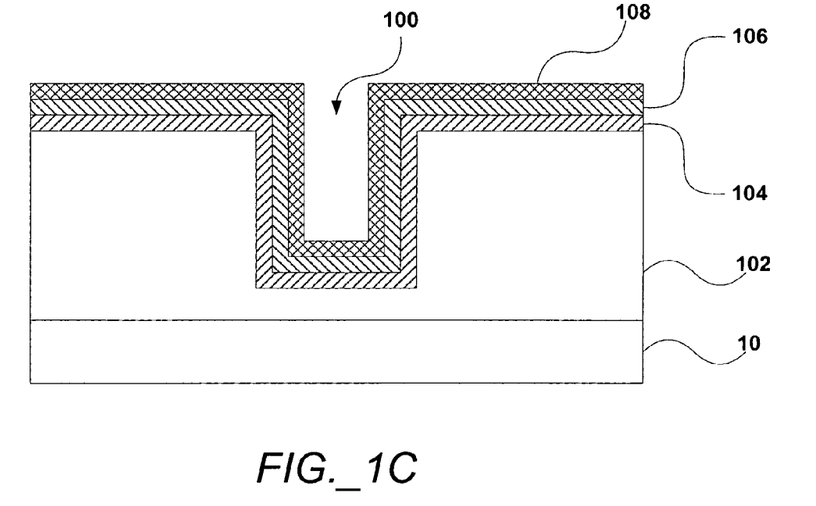

FIG. 1C illustrates the trench 100 after a copper seed layer 108 has been deposited onto the adhesion layer 106. The copper seed layer 108 is generally deposited using a physical vapor deposition process (PVD). Other deposition processes may also be used to deposit the copper seed layer 108. The copper seed layer 108 enables or catalyzes a subsequent plating process to fill the interconnect with copper metal. As shown in FIG. 1C, the deposition of the copper seed layer 108 further reduces the available gap 101 for subsequent metallization.

Figure 1D:
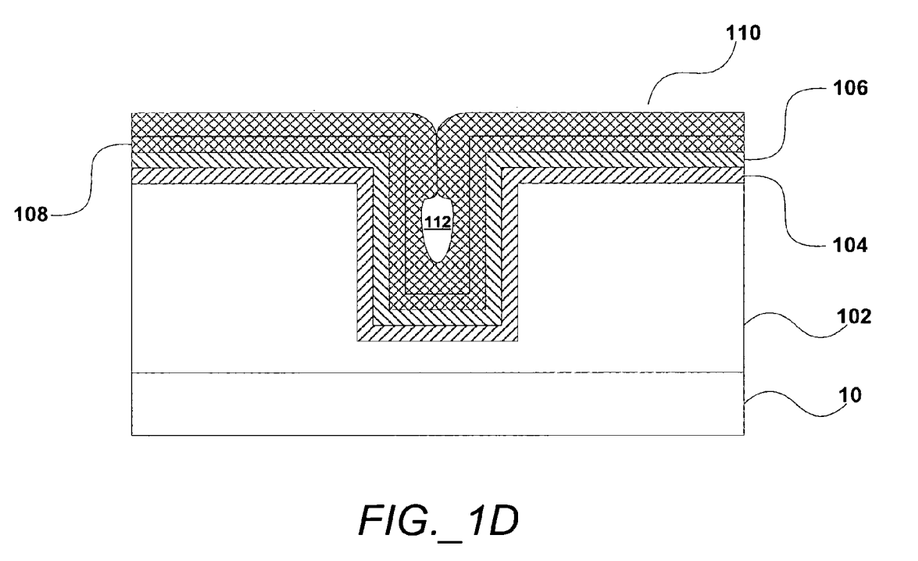

FIG. 1D illustrates the trench 100 after an electroplating process or an electroless plating process has been used to fill the trench with copper metal 110. The copper metal 110 enters the trench through the gap 101 where, depending on the width of the gap 101, issues such as trench overhang and pinching off of the trench opening may occur that lead to defects. For instance, as shown in FIG. 1D, trench overhang may occur that pinches off the opening of the trench 100, creating a void 112 that will appear in the final interconnect structure.

Figure 1E:
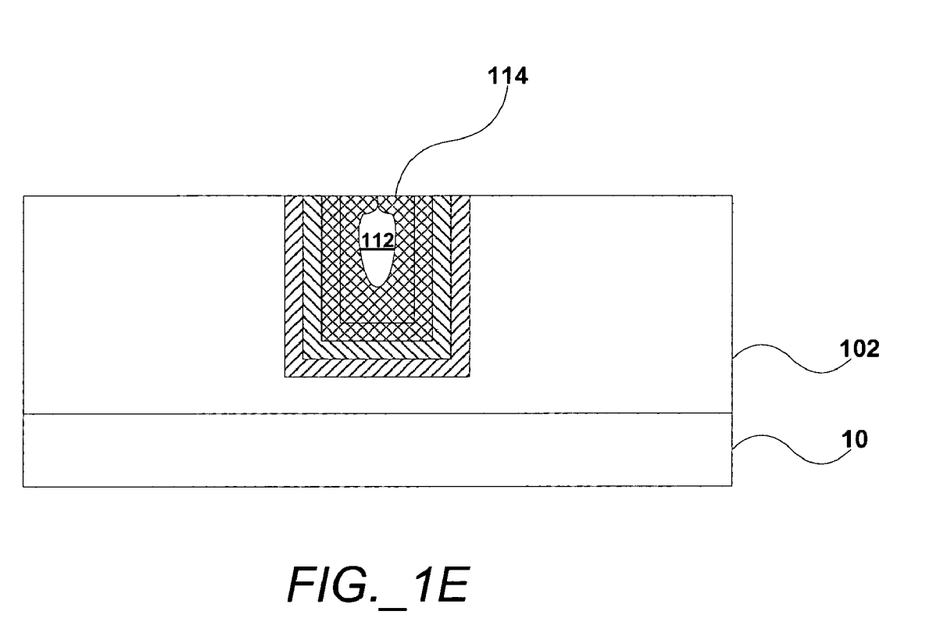

FIG. 1E illustrates the trench 100 after a chemical mechanical polishing (CMP) process is used to planarize the deposited copper metal 110. The CMP results in the formation of a copper interconnect 114. As shown, the copper interconnect 114 includes the void 112 that was formed when the available gap 101 was too narrow and the resulting trench overhang pinched off the trench opening.

To address the trench overhang issue that occurs in conventional processes for making metal interconnects, implementations of the invention provide methods of depositing metal onto a barrier layer, such as a tantalum nitride layer, without the need for an adhesion layer. Elimination of the adhesion layer widens the trench gap that is available for metallization, thereby allowing the plated metal to more easily enter the trench and substantially reducing or eliminating the occurrence of trench overhang.

In accordance with implementations of the invention, a layer of a metal catalyst is formed on the barrier layer to initiate the deposition of, a metal directly onto the barrier layer without the need for an adhesion layer. In some implementations, the metal catalyst may be one or a combination of palladium, platinum, ruthenium, iridium, rhenium, rhodium, or osmium. In some implementations, the metal catalyst may be formed on the barrier layer using a wet chemical MIP surface treatment. For instance, if the metal catalyst is palladium, a conventional palladium immobilization process (PIP), which is well known in the art, may be used to form a layer of palladium on the barrier layer.

Figure 2:
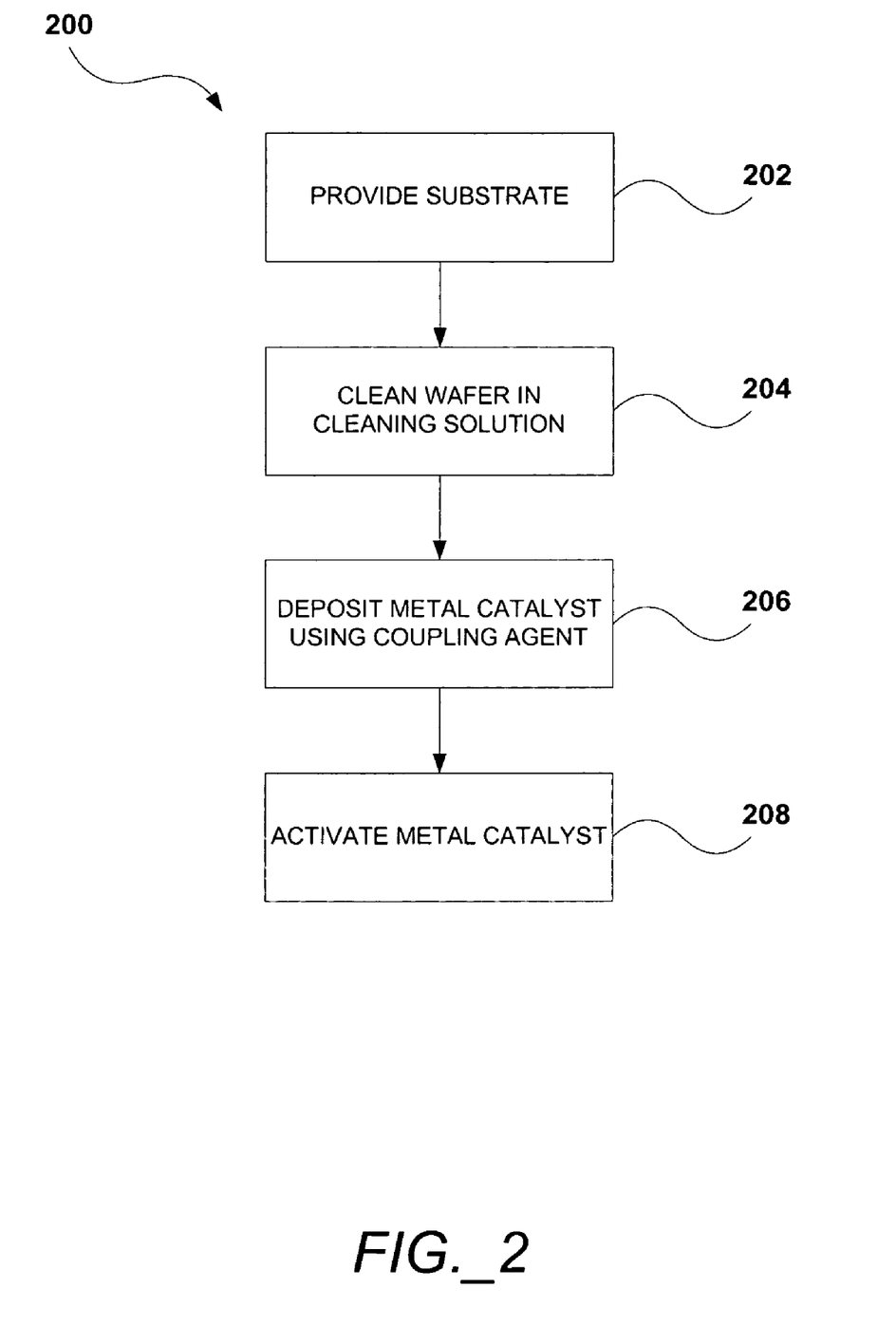
FIG. 2 is a palladium immobilization process.

FIG. 2 describes one implementation of a MIP surface treatment 200. The process 200 begins by providing a semiconductor substrate onto which a copper interconnect may be formed (202). For instance, the semiconductor substrate may be a semiconductor wafer that includes a dielectric layer on its surface. The dielectric layer may include at least one trench in which the copper interconnect is to be formed.

The substrate may be cleaned to remove impurities, contaminants, and/or oxides (204). The cleaning solution used may be an alkaline solution or a pure water rinse. The cleaning solutions may contain surfactants (e.g. polyoxyethylene derivatives), phosphates, and/or carbonates in alkaline media. These cleaning solutions tend to make the semiconductor substrate more hydrophilic and tend to remove loose particles due to the fluid motion on the wafer.

Figure 3:
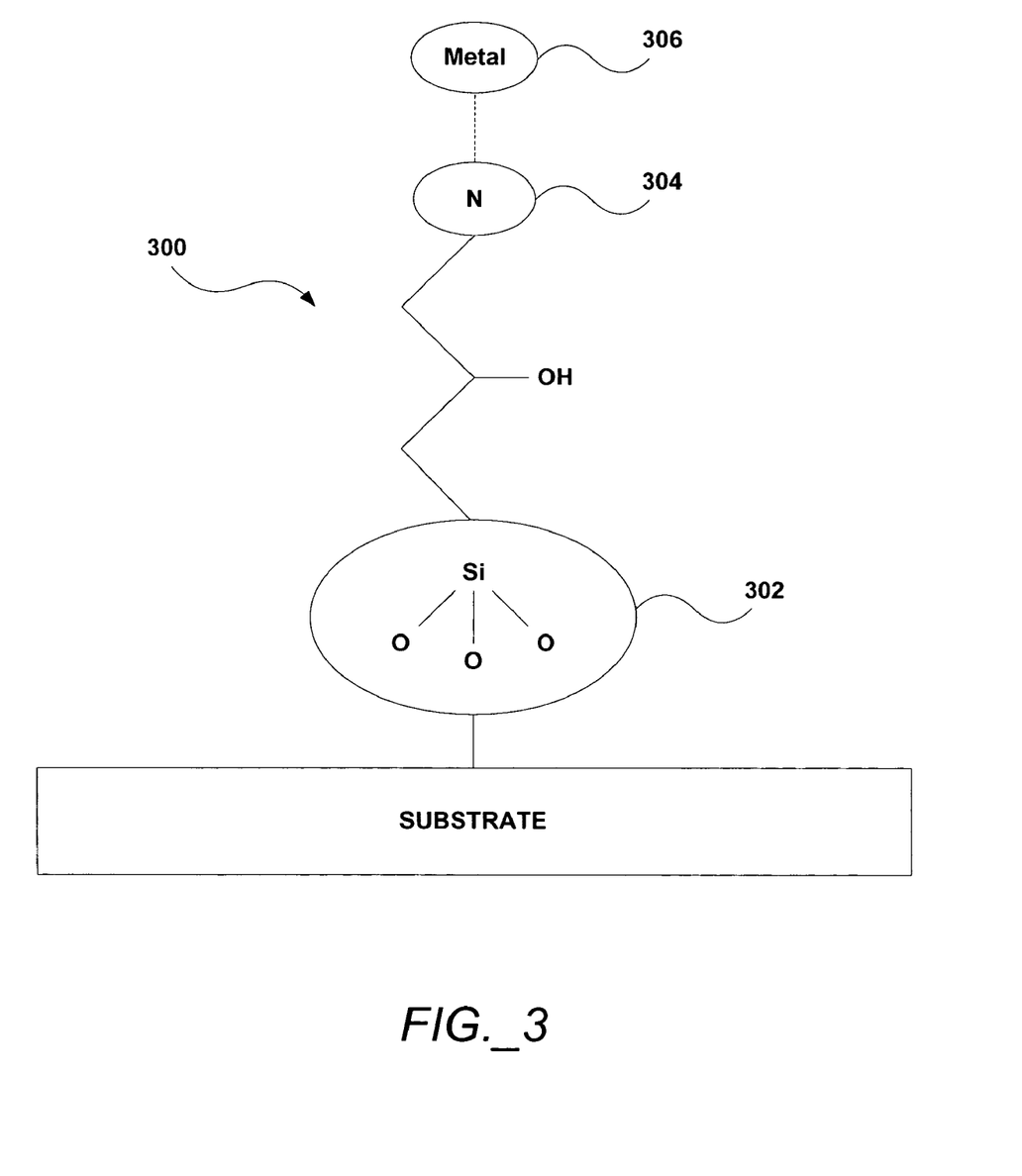
FIG. 3 illustrates a coupling agent and a metal catalyst.

After the cleaning process, a metal catalyst may be deposited on the substrate and into the trench using a coupling agent (206). Turning to FIG. 3, an exemplary coupling agent 300 is shown. The coupling agent may include silicon, for instance, the coupling agent may be a silyl group 302, which has the ability to bond strongly to many different types of substrates, including semiconductor substrates. The coupling agent may also include a nitrogen group 304, which has the ability to bond to the metal catalyst. The nitrogen group 304 may be provided by an amine or azo group. For instance, in the implementation shown, the coupling agent 300 may be an azo-silyl moiety and the nitrogen group 304 may be provided by an azo group. A metal catalyst 306 may bond to the nitrogen 304 of the coupling agent 300. In various implementations of the invention, the metal catalyst may be palladium, platinum, ruthenium, iridium, rhenium, rhodium, or osnium.

The coupling agent 300 and the metal catalyst 306 may be applied using any one of a variety of techniques. In some implementations, chemical vapor deposition (CVD) or atomic layer deposition (ALD) may be used. In other implementations, a wet chemical process may be used in which the substrate may be immersed in a solution containing both the coupling agent 300 and the metal catalyst 306. In further implementations, a wet chemical process may be used in which the coupling agent 300 and the metal catalyst 306 may be provided in separate solutions, and the substrate may be separately immersed in each solution. When the substrate is immersed, the coupling agent 300, such as the azo-silyl moiety, attaches to the substrate with the silyl group bonded to the substrate and the azo group exposed. The metal catalyst 306 may bond to the nitrogen in the exposed azo group. This results in the formation of a layer of metal catalyst over the nitrogen.

Returning to FIG. 2, the metal catalyst is then activated after bonding to the substrate (208). As is well known in the art, the metal catalyst may be activated by exposing the metal to a reducing agent. When activated, the metal center is electronically neutral and is in the metallic state. A layer of activated metal catalyst is now affixed to the surface of the substrate. The underlying nitrogen acts as an immobilizing structure that holds the metal catalyst in place on the substrate.

In conventional processes, the substrate with the layer of activated metal catalyst may be immersed into an electroless copper bath to deposit a copper seed layer over the metal catalyst layer as mediated by the catalytic activity of the MIP surface treatment. This may be followed by an electroplating process to deposit a thick copper layer on the copper seed layer that fills the trench and serves as the electrical interconnect. Contrary to conventional processes, however, implementations of the invention follow the MIP surface treatment with a vapor deposition process, such as a CVD or ALD process, to form a metal seed layer or to completely fill the trench with metal.

Figure 4:
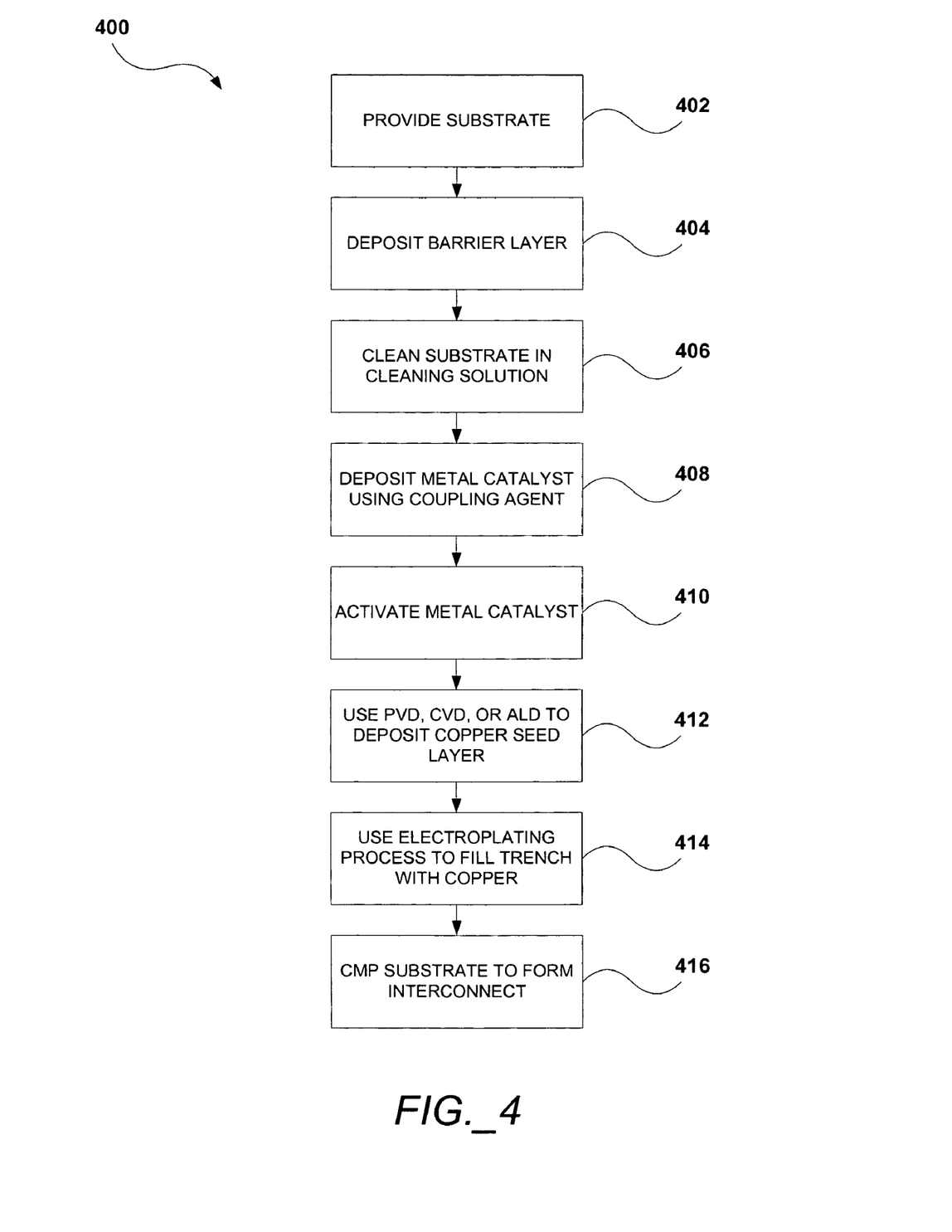
FIG. 4 is a method of forming an interconnect in accordance with an implementation of the invention.

FIG. 4 is a method 400 of forming a metal interconnect in accordance with an implementation of the invention. A substrate is provided, such as a semiconductor wafer, upon which the metal interconnect is to be formed (402). The substrate includes a dielectric layer formed on a surface of the substrate, and the dielectric layer includes a trench that has been etched into the dielectric layer. Conventional photolithography techniques may be used to etch the trench into the dielectric layer. The metal interconnect is formed within the trench.

A barrier layer is deposited within the trench (404). Conventional metal deposition processes such as PVD, CVD or ALD may be used to deposit the barrier layer. The barrier layer serves to prevent the diffusion of metal from the interconnect into the dielectric layer. For instance, the barrier layer prevents copper from diffusing into the dielectric layer which degrades performance of the interconnect and may lead to electrical short circuits. In implementations of the invention, the barrier layer may be formed using materials such as tantalum, tantalum nitride, tantalum carbide, or tantalum carbonitride. In further implementations alternative materials that are well known in the art may be used.

The substrate may then be immersed in or sprayed with a cleaning solution to remove impurities, contaminants, and/or oxides (406). As described above, the cleaning solution used may be an alkaline solution or a pure water rinse that may contain surfactants, phosphates, and/or carbonates in alkaline media.

After the cleaning process, the substrate may undergo an MIP surface treatment to form a metal catalyst layer over the barrier layer. For instance, in one implementation, the substrate may be immersed in or sprayed with one or more solutions that deposit a coupling agent and a metal catalyst layer onto the barrier layer (408). The coupling agent may include a silyl group and a nitrogen group. For instance, the coupling agent may be an azo-silyl moiety. In implementations of the invention, the metal catalyst may include, but is not limited to, palladium, platinum, ruthenium, iridium, rhenium, rhodium, or osmium. The result is the formation of a layer of metal catalyst over the barrier layer.

The substrate may then be immersed in or sprayed with an activator solution to activate the metal catalyst after bonding to the substrate (410). For instance, the metal catalyst may be activated by exposing the metal catalyst to a reducing agent solution. In one implementation where the metal catalyst is palladium, the reducing agent reduces the palladium from an oxidized state to a $Pd^0$ state. The layer of activated metal catalyst is now affixed to the surface of the substrate.

After the metal catalyst layer is prepared, a vapor deposition process may be carried out to deposit a metal seed layer onto the metal catalyst layer (412). In one implementation, the deposition process may be PVD, CVD, or ALD and the metal may be copper metal. In implementations of the invention, the deposition of the copper seed layer is performed within a short queue time of less than four hours after the preparation of the metal catalyst layer.

In some implementations of the invention, an organometallic precursor, may be used in the PVD, CVD, or ALD process to deposit the copper seed layer. For example, in one implementation, bis(N,N'-di-sec-butylacetamidinato)copper may be used with a vaporization temperature of less than 150° C. and a substrate temperature around 250° C. in forming gas.

In further implementations of the invention, alternate organometallic precursors may be used in the deposition of the copper seed layer. These alternate organometallic precursors include, but are not limited to, bis(N,N'-di-sec-butylacetamidinato)copper, bis(N,N'-di-isopropylacetamidinato)copper, bis(N,N'-di-isopropyldimethylaminoacetamidinato)copper, (VTMS)Cu(I)β-diketiminate (where VTMS=vinyltrimetylsilyl), (VTMS)Cu(I)amidinates, copper methoxypropylamidinates, Cu(II) dimethylaminoethoxide, Cu(II) bis(2,2,6,6-tetramethyl-3,5-heptanedionate), Cu(II) bis(2,2-dimethyl-3,5-heptanedionate), Cu(II) bis(2,2-dimethylhexanedionate), Cu(II) bis(acetylacetonate), Cu(II) bis(hexafluoroacetylacetate), Cu methyl(trimethyl)acetyl-thioacetate, Cu methylthiocarboxylate triphenylphosphine, Cu(I) hexamethyldisilazane, CuI, $CuBr_2$, CuBr, CuCl, $CuI_2$, cyclopentadienyl-Cu(I)-triethylphosphine, cyclopentadienyl-Cu(I)-trimethylphosphine, cyclopentadienyl copper (I) triphenylphosphine, Cu(I) tert-butoxide tetramer, Cu(II)methoxide, Cu(II) bis(dimethyldithiocarbamate), Cu(II) bis(diethyldithiocarbamate), Cu(II) bis(diisobutyldithiocarbamate), Cu(II) bis(methyl-butyldithiocarbamate), Cu(II) bis(methylhexyldithiocarbamate), Cu(II)(ethoxide), Cu(II)dimethylaminoethoxide, Cu(I)hfacVTMS, $Cu(II)(1$-phenyl-1,3-butanedione$)_2$, $Cu(II)(1$-$(2$-thienyl)-1,3-butanedione$)_2$, $Cu(II)(1,3$-$(2$-thienyl)-1,3-propanedione$)_2$, $Cu(acac)_2$, and $Cu(thd)_2$.

An electroplating process may then be carried out to fill the trench with copper metal (414). The copper seed layer deposited by the vapor deposition process facilitates the bulk deposition of copper metal by the electroplating process. Conventional techniques may be used in the electroplating process. Finally, a chemical mechanical polishing process may be used to planarize the copper and remove any excess (416), thereby forming the final copper interconnect structure.

In an alternative implementation, rather than using an electroplating process, the vapor deposition process may be used to fill the trench and form the entire copper interconnect structure. Because the PVD, CVD, or ALD process forms the entire interconnect, the electroplating process becomes unnecessary.

Figure 5A:
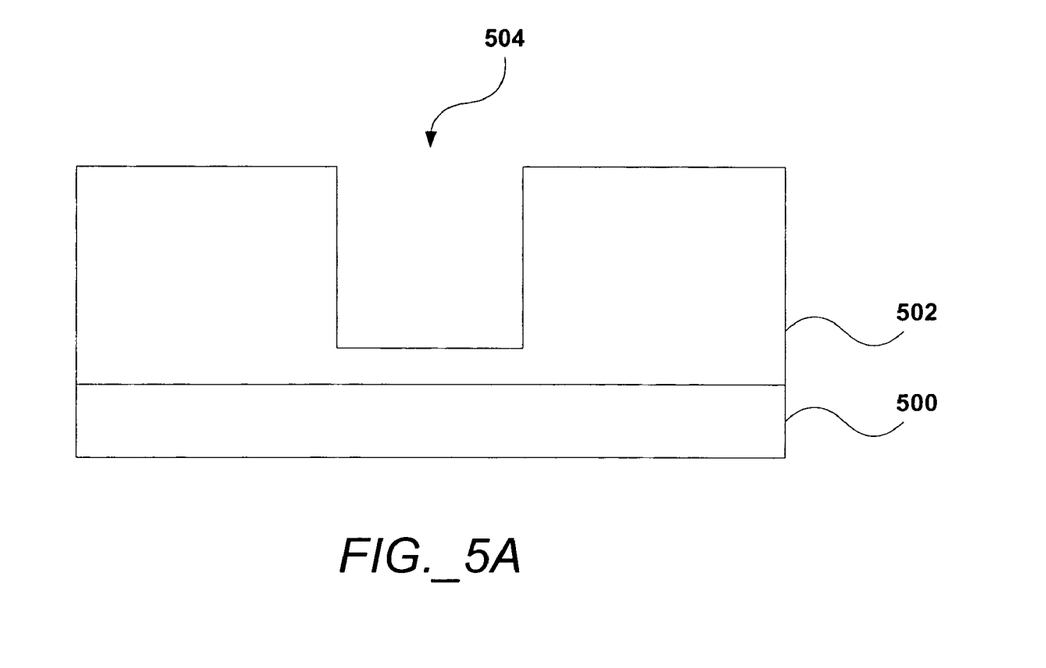
FIGS. 5A to 5F illustrate the method of FIG. 4.

FIGS. 5A to 5F illustrate the process steps of the method 400 from FIG. 4. FIG. 5A shows the substrate 500 having a dielectric layer 502 and a trench 504 that has been etched into the dielectric layer 502.

Figure 5B:
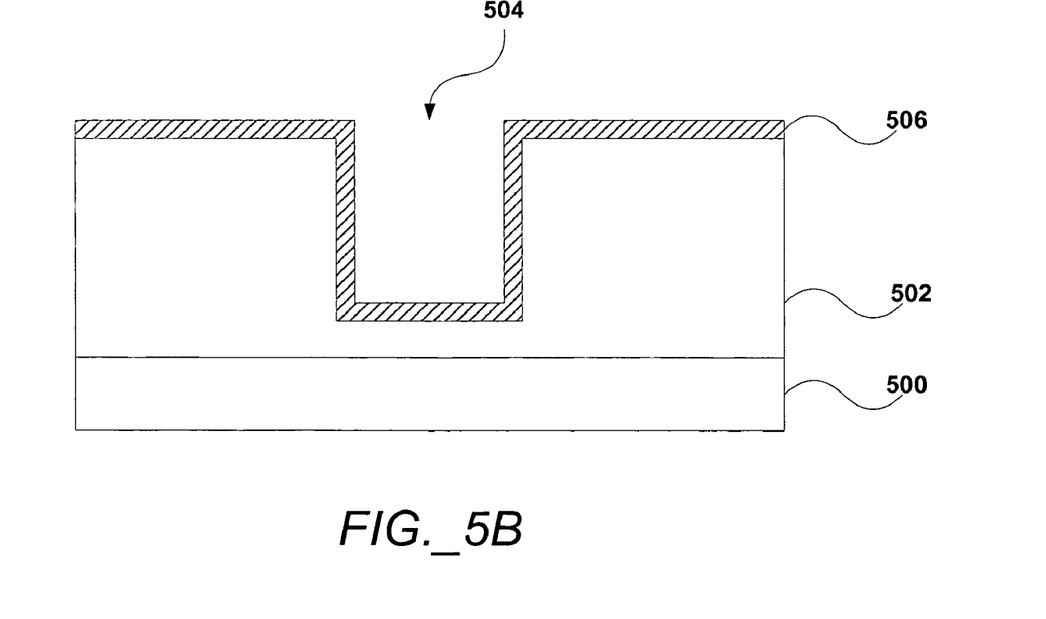

FIG. 5B illustrates the deposition of a barrier layer 506 onto the dielectric layer 502 and within the trench 504. As noted above, the barrier layer 506 may be formed using vapor deposition techniques and may consist of materials that include, but are not limited to, tantalum, tantalum nitride, tantalum carbide, or tantalum carbonitride.

Figure 5C:
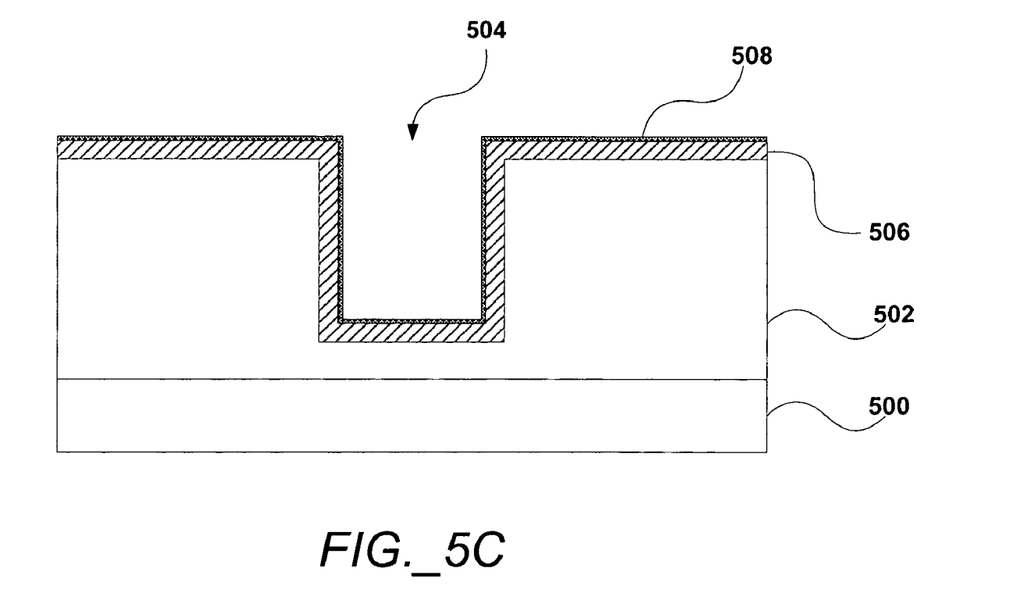

Although not shown, the substrate 500 is then cleaned and immersed in or sprayed with MIP surface treatment solutions. The result, shown in FIG. 5C, is the formation of a metal catalyst layer 508 that is attached to the barrier layer 506 by a coupling agent. It should be noted that while the metal catalyst layer 508 is visible in FIG. 5C, the metal catalyst layer 508 is very thin relative to the barrier layer 506 and the layers shown in FIG. 5C may not be to scale. For instance, the combination of the metal catalyst layer 508 and the coupling agent typically form only a single monolayer. In implementations of the invention, the metal catalyst layer 508 may include, but is not limited to, metals such as palladium, platinum, ruthenium, iridium, rhenium, rhodium, or osmium. The metal catalyst layer 508 is then exposed to an MIP activator solution to reduce and activate the metal catalyst.

Figure 5D:
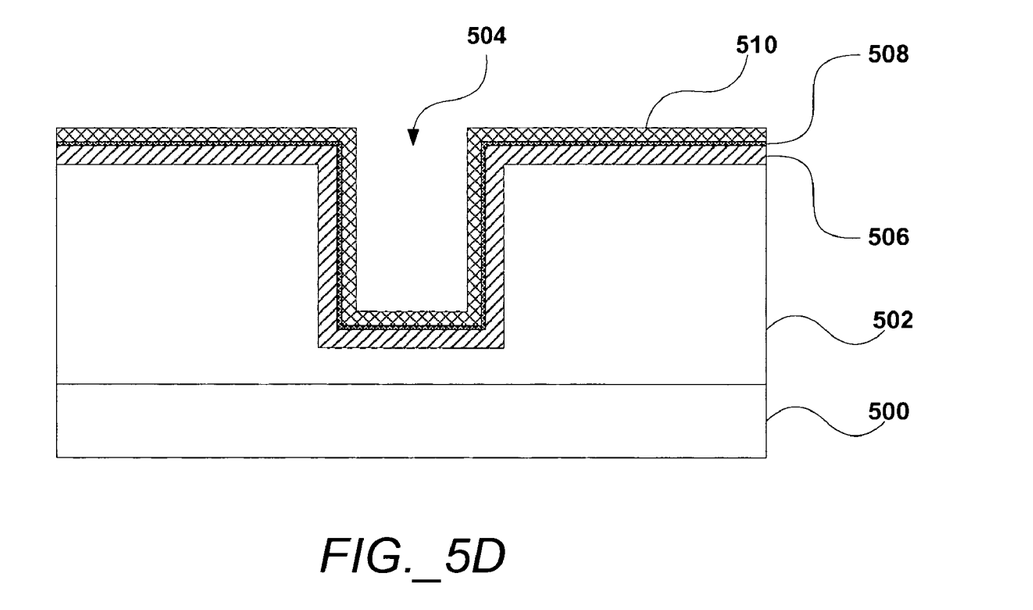

Turning to FIG. 5D, a vapor deposition process, such as PVD, CVD, or ALD, is used to deposit a metal seed layer 510 onto the metal catalyst layer 508. The metal catalyst layer 508 enables the metal seed layer 510 to become deposited onto the barrier layer 506 without the need for a conventional adhesion layer, thereby widening the available gap for metallization. The metal seed layer 510 may be a copper seed layer. The organometallic precursors described above may be used in the vapor deposition process to form the copper seed layer.

Figure 5E:
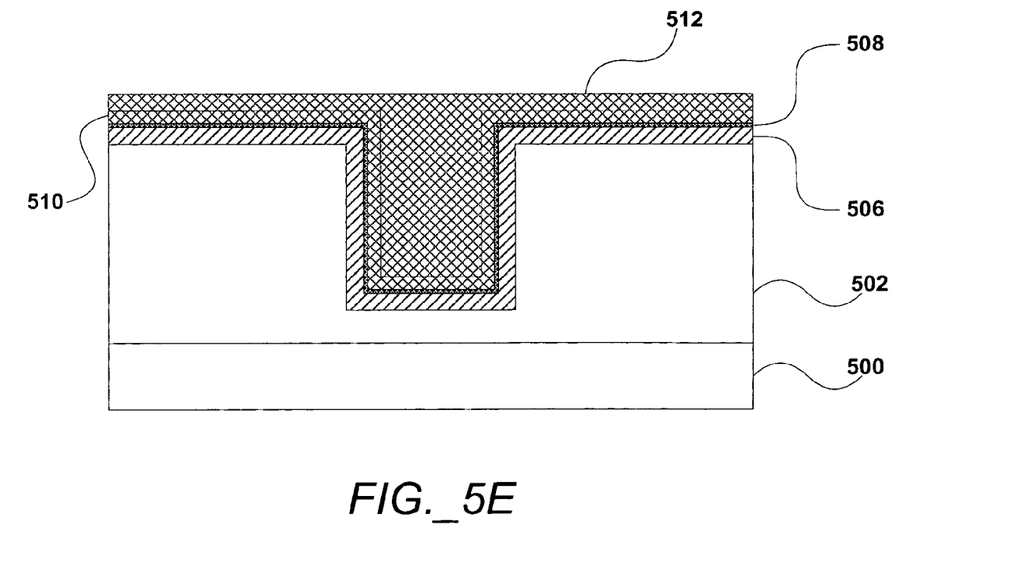

As shown in FIG. 5E, an electroplating process may be used to fill the trench 504 with copper metal 512. The metal seed layer 510 provides a surface upon which the electroplating process may occur. Because the trench gap that is available for metallization is wider than in conventional processes due to the absence of an adhesion layer, the probability of trench overhang occurring is reduced. This in turn reduces the likelihood of void formation within the trench.

Figure 5F:
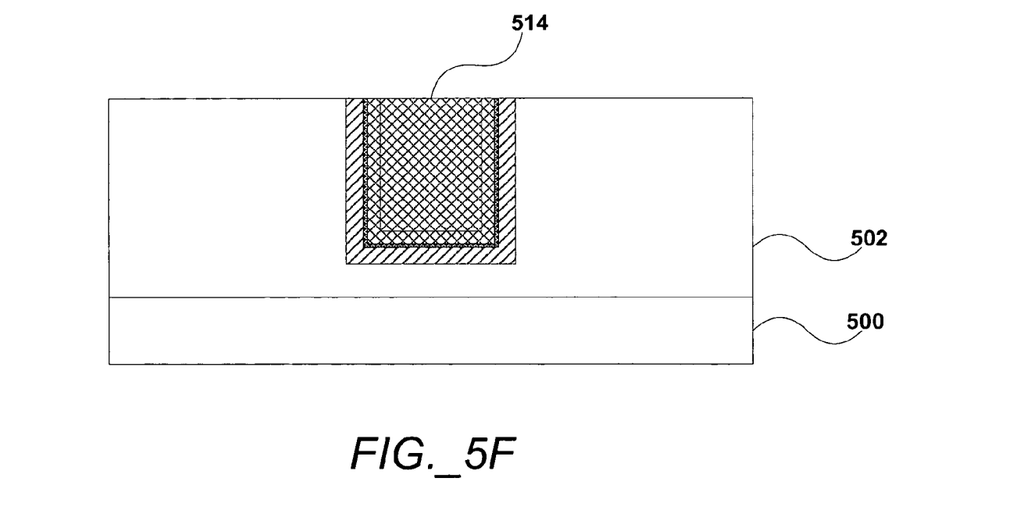

Finally, as shown in FIG. 5F, a chemical mechanical polishing process may be performed to planarize the electroplated copper metal 512 and form the final interconnect structure 514. As shown, the interconnect 514 may be formed without the occurrence of voids that would otherwise degrade performance of the interconnect 514.

Accordingly, implementations of the invention provide methods for producing copper interconnects with improved film adhesion between the copper layer and the barrier layer that do not require an intervening adhesion layer. The metal catalyst layer that is used to bind the copper metal to the barrier layer is a molecularly thin layer wherein covalent bonds between the metal catalyst layer and the barrier layer render the metal layer resistant to delamination.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   providing a substrate that includes a dielectric layer and a trench etched into the dielectric layer;
   depositing a barrier layer onto the dielectric layer and within the trench;
   applying a azo-silyl moiety and a metal catalyst to the substrate, wherein the metal catalyst couples to the barrier layer by means of the azo-silyl moiety;
   activating the metal catalyst;
   using a vapor deposition process to deposit a metal seed layer onto the metal catalyst; and
   using an electroplating process to deposit a bulk metal layer onto the metal seed layer.

2. The method of claim 1, wherein the substrate is a semiconductor wafer.

3. The method of claim 1, wherein the barrier layer comprises at least one of tantalum, tantalum nitride, tantalum carbide, or tantalum carbonitride.

4. The method of claim 1, wherein the depositing of the barrier layer comprises using a vapor deposition process to deposit the barrier layer onto the dielectric layer and within the trench.

5. The method of claim 1, wherein the metal catalyst comprises at least one of palladium, platinum, ruthenium, iridium, rhenium, rhodium, or osmium.

6. The method of claim 1, wherein the applying of the azo-silyl moiety and the metal catalyst to the substrate comprises applying a first solution to the substrate that includes the azo-silyl moiety and applying a second solution to the substrate that includes the metal catalyst.

7. The method of claim 1, wherein the applying of the azo-silyl moiety and the metal catalyst to the substrate comprises applying a solution to the substrate that includes both the azo-silyl moiety and the metal catalyst.

8. The method of claim 1, wherein the activating of the metal catalyst comprises applying a reducing agent to the metal catalyst.

9. The method of claim 8, wherein the applying of the reducing agent comprises applying at least one solution to the metal catalyst that includes the reducing agent.

10. The method of claim 1, wherein the vapor deposition process comprises physical vapor deposition, chemical vapor deposition, or atomic layer deposition.

11. The method of claim 1, wherein the metal seed layer comprises a copper seed layer.

12. The method of claim 1, wherein the bulk metal layer comprises a bulk copper layer.

13. The method of claim 1, wherein using the electroplating process to deposit the bulk metal layer comprises filling the trench with a metal layer.

14. The method of claim 11, wherein the vapor deposition process uses an organometallic precursor containing copper to form the copper seed layer.

15. The method of claim 14, wherein the organometallic precursor comprises at least one of bis(N,N'-di-sec-butylacetamidinato)copper, bis(N,N'-di-isopropylacetamidinato) copper, bis(N,N'-di-isopropyldimethylaminoacetamidinato) copper, (VTMS)Cu(I)β-diketiminate (where VTMS=vinyltrimetylsilyl), (VTMS)Cu(I)amidinates, copper methoxypropylamidinates, Cu(II) dimethylaminoethoxide, Cu(II) bis(2,2,6,6-tetramethyl-3,5-heptanedionate), Cu(II) bis(2,2-dimethyl-3,5-heptanedionate), Cu(II) bis(2,2-dimethylhexanedionate), Cu(II) bis(acetylacetonate), Cu(II) bis(hexafluoroacetylacetate), Cu methyl(trimethyl)acetylthioacetate, Cu methylthiocarboxylate triphenylphosphine, Cu(I) hexamethyldisilazane, CuI, CuBr$_2$, CuBr, CuCl, CuI$_2$, cyclopentadienyl-Cu(I)-triethylphosphine, cyclopentadienyl-Cu(I)-trimethylphosphine, cyclopentadienyl copper (I) triphenylphosphine, Cu(I) tert-butoxide tetramer, Cu(II) methoxide, Cu(II) bis(dimethyldithiocarbamate), Cu(II) bis (diethyldithiocarbamate), Cu(II) bis(diisobutyldithiocarbamate), Cu(II) bis(methyl-butyl-dithiocarbamate), Cu(II) bis(methylhexyldithiocarbamate), Cu (II)(ethoxide), Cu(II) dimethylaminoethoxide, Cu(I)hfac-VTMS, Cu(II)(1-phenyl-1,3-butanedione)$_2$, Cu(II)(1-(2-thienyl)-1,3-butanedione)$_2$, Cu(II)(1,3-(2-thienyl)-1,3-propanedione)$_2$, Cu(acac)$_2$, and Cu(thd)$_2$.

16. The method of claim 4, wherein the vapor deposition process to deposit the barrier layer comprises physical vapor deposition, chemical vapor deposition, or atomic layer deposition.

17. The method of claim 1, further comprising cleaning the substrate after depositing the barrier layer and before applying the azo-silyl moiety and the metal catalyst to the substrate.

18. The method of claim 1, further comprising performing a chemical mechanical polishing process on the substrate after the deposition of the bulk metal layer.

19. A method comprising:
providing a substrate including a dielectric layer and a trench etched into the dielectric layer;
depositing a barrier layer within the trench;
using a wet chemical metal-immobilization-process surface treatment to form a metal catalyst layer on the barrier layer;
activating the metal catalyst layer;
using a vapor deposition process to fill the trench with a metal layer, wherein the vapor deposition process uses at least one organometallic precursor selected from the group consisting of bis(N,N'-di-sec-butylacetamidinato)copper, bis(N,N'-di-isopropylacetamidinato)copper, bis(N,N'-di-isopropyldimethylaminoacetamidinato)copper, (VTMS)Cu(I)β-diketiminate (where VTMS=vinyltrimetylsilyl), (VTMS)Cu(I)amidinates, copper methoxypropylamidinates, Cu(II) dimethylaminoethoxide, Cu(II) bis(2,2,6,6-tetramethyl-3,5-heptanedionate), Cu(II) bis(2,2-dimethyl-3,5-heptanedionate), Cu(II) bis(2,2-dimethylhexanedionate), Cu(II) bis(acetylacetonate), Cu(II) bis(hexafluoroacetylacetate), Cu methyl(trimethyl)acetyl-thioacetate, Cu methylthiocarboxylate triphenylphosphine, Cu(I) hexamethyldisilazane, CuI, CuBr$_2$, CuBr, CuCl, CuI$_2$, cyclopentadienyl-Cu(I)-triethylphosphine, cyclopentadienyl-Cu(I)-trimethylphosphine, cyclopentadienyl copper (I) triphenylphosphine, Cu(I) tert-butoxide tetramer, Cu(I)methoxide, Cu(II) bis(dimethyldithiocarbamate), Cu(II) bis(diethyldithiocarbamate), Cu(II) bis(diisobutyldithiocarbamate), Cu(II) bis(methyl-butyl-dithiocarbamate), Cu(II) bis(methylhexyldithiocarbamate), Cu(II)(ethoxide), Cu(II)dimethylaminoethoxide, Cu(I) hfac-VTMS, Cu(II)(1-phenyl-1,3-butanedione)$_2$, Cu(II)(1-(2-thienyl)-1,3-butanedione)$_2$, Cu(II) (1,3-(2-thienyl)-1,3-propanedione)$_2$, Cu(acac)$_2$, and Cu(thd)$_2$; and
planarizing the substrate to form an interconnect.

20. The method of claim 19, wherein the barrier layer comprises at least one of tantalum, tantalum nitride, tantalum carbide, or tantalum carbonitride.

21. The method of claim 19, wherein the metal catalyst layer comprises a palladium layer.

22. The method of claim 21, wherein the activating of the palladium layer comprises reducing the palladium metal from an oxidized state to a Pd$^0$ state.

23. The method of claim 19, wherein the vapor deposition process comprises PVD, CVD, or ALD.

24. A method comprising:
providing a substrate including a dielectric layer and a trench etched into the dielectric layer;
depositing a barrier layer within the trench;
using a palladium immobilization process to form a palladium layer on the barrier layer and to activate the palladium layer;
using a vapor deposition process to deposit a copper seed layer onto the activated palladium layer;
using an electroless plating process to deposit a bulk copper layer onto the copper seed layer; and
planarizing the substrate to form a copper interconnect.

25. The method of claim 24, wherein the vapor deposition process comprises PVD, CVD, or ALD.

* * * * *